(12) United States Patent
Zhu

(10) Patent No.: US 12,506,013 B2
(45) Date of Patent: Dec. 23, 2025

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventor: Meng Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 413 days.

(21) Appl. No.: 18/163,078

(22) Filed: Feb. 1, 2023

(65) Prior Publication Data

US 2023/0187219 A1    Jun. 15, 2023

Related U.S. Application Data

(63) Continuation of application No. PCT/CN2022/091807, filed on May 9, 2022.

(30) Foreign Application Priority Data

Jul. 8, 2021    (CN) ......................... 202110775030.X

(51) Int. Cl.
| | |
|---|---|
| H01L 21/3205 | (2006.01) |
| H01L 21/02 | (2006.01) |
| H01L 21/027 | (2006.01) |
| H01L 21/033 | (2006.01) |
| H01L 21/311 | (2006.01) |
| H01L 21/321 | (2006.01) |
| H01L 21/3213 | (2006.01) |
| H01L 21/762 | (2006.01) |

(52) U.S. Cl.
CPC .... *H01L 21/32055* (2013.01); *H01L 21/0214* (2013.01); *H01L 21/02252* (2013.01); *H01L 21/0271* (2013.01); *H01L 21/0332* (2013.01); *H01L 21/0337* (2013.01); *H01L 21/31116* (2013.01); *H01L 21/31144* (2013.01); *H01L 21/3211* (2013.01); *H01L 21/32139* (2013.01); *H01L 21/76224* (2013.01)

(58) Field of Classification Search
None
See application file for complete search history.

(56) References Cited

U.S. PATENT DOCUMENTS

| | | | |
|---|---|---|---|
| 5,677,234 A | 10/1997 | Koo | |
| 2005/0048705 A1* | 3/2005 | Burnham | ............ H01L 21/0234 |
| | | | 257/E21.268 |

(Continued)

FOREIGN PATENT DOCUMENTS

| | | |
|---|---|---|
| CN | 105009259 B | 11/2018 |
| CN | 113035699 A | 6/2021 |
| TW | 350121 B | 1/1999 |

OTHER PUBLICATIONS

International Search Report in the international application No. PCT/CN2022/091807, mailed on Jun. 30, 2022.

*Primary Examiner* — Khaja Ahmad
(74) *Attorney, Agent, or Firm* — Syncoda LLC; Feng Ma

(57) ABSTRACT

A method for manufacturing a semiconductor includes: providing a substrate; forming a polysilicon layer on the substrate, a surface, away from the substrate, of the polysilicon layer having a native oxide; and performing a nitriding treatment to the native oxide, to nitrogenize the native oxide into a silicon oxynitride layer. The native oxide is nitrogenized into the silicon oxynitride layer.

18 Claims, 24 Drawing Sheets

(56) References Cited

U.S. PATENT DOCUMENTS

2010/0308382 A1 12/2010 Johnson
2016/0172191 A1* 6/2016 Hirano ............. H01L 21/02068
                438/765

* cited by examiner

SEMICONDUCTOR STRUCTURE AND METHOD FOR MANUFACTURING SAME

CROSS-REFERENCE TO RELATED APPLICATIONS

This is a continuation of International Patent Application No. PCT/CN2022/091807 filed on May 9, 2022, which claims priority to Chinese Patent Application No. 202110775030.X filed on Jul. 8, 2021. The disclosures of the above-referenced applications are hereby incorporated by reference in their entirety.

BACKGROUND

In a manufacture process of a semiconductor structure, it is usually necessary to form a specific pattern in a substrate or a film layer by photolithography, etching, etc. In the case that a mask layer or the film layer includes a polysilicon layer, when the polysilicon layer is formed, an oxidation reaction between the silicon on a surface of the polysilicon layer and oxygen or water vapor forms a silicon dioxide layer with a certain thickness. The silicon dioxide layer is referred to as a native oxide. The native oxide will cause a lateral etch in a subsequent process, which renders the mask patterns fragmentary and affects the performance of a semiconductor structure.

In a related art, the native oxide may be removed by hydrofluoric acid (HF) solution at first, and then the HF remaining on a polycrystalline layer may be removed by using deionized water. However, during the removal of the HF, the surface of the polysilicon layer will be oxidized again and thus the native oxide is formed again. The native oxide will render the mask patterns fragmentary in the subsequent process, thereby affecting the yield of semiconductor structures.

SUMMARY

The disclosure relates to the technical field of semiconductors, and in particular, to a semiconductor structure and a method for manufacturing same.

In a first aspect, an embodiment of the disclosure provides a method for manufacturing a semiconductor structure, which may include the following operations of:
   providing a substrate;
   forming a polysilicon layer on the substrate, wherein a surface, away from the substrate, of the polysilicon layer has a native oxide; and
   performing a nitriding treatment to the native oxide, to nitrogenize the native oxide into a silicon oxynitride layer.

In some embodiments, the operation of performing a nitriding treatment to the native oxide may include a operation of:
   performing plasma ionization to a nitrogen-containing gas to from nitrogen-containing plasma, and then treating the surface of the native oxide by the nitrogen-containing plasma.

In a second aspect, an embodiment of the disclosure provides a semiconductor structure. The semiconductor structure is manufactured by the method for manufacturing a semiconductor structure described above.

BRIEF DESCRIPTION OF THE DRAWINGS

In order to more clearly illustrate the embodiments of the disclosure or the technical solutions in the conventional art, the drawings used in the description of the embodiments or the conventional art will be briefly described below. It is apparent that the drawings in the following description are some embodiments of the disclosure, and other drawings can be obtained by those skilled in the art according to these drawings without any creative work.

DETAILED DESCRIPTION

Figure 1:
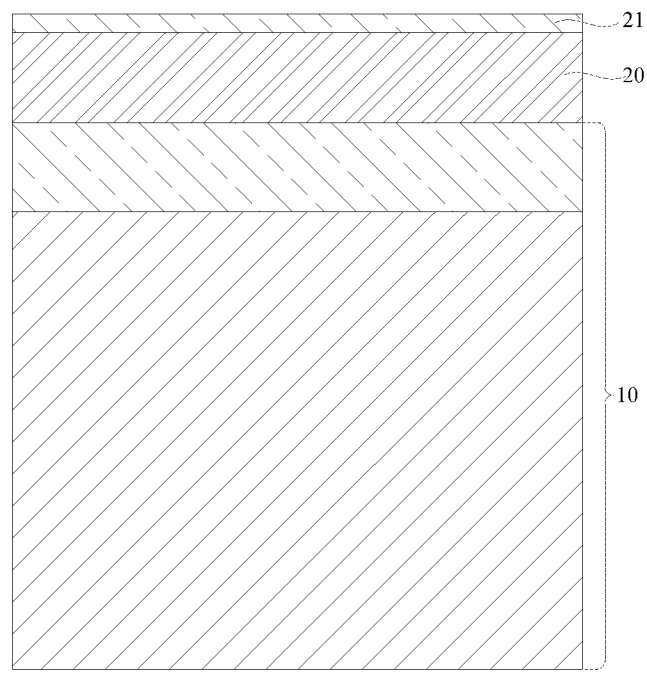
FIG. 1 illustrates a schematic view of forming a native oxide in a method for manufacturing a semiconductor structure according to the embodiments of the disclosure.
Figure 2:
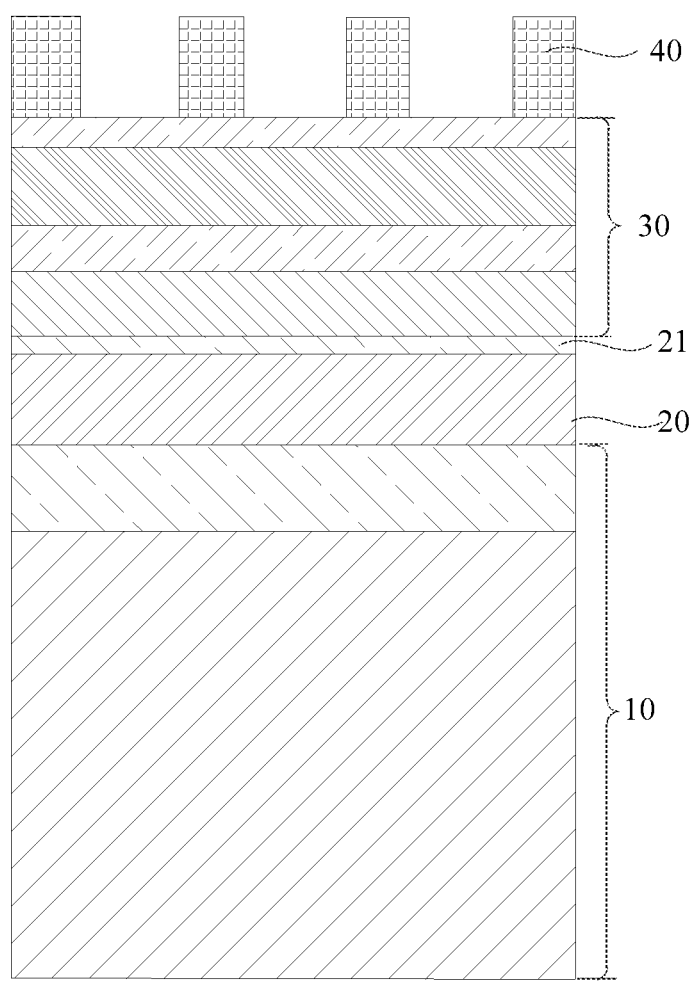
FIG. 2 illustrates a schematic view of forming a first mask layer in a method for manufacturing a semiconductor structure according to the embodiments of the disclosure.
Figure 3:
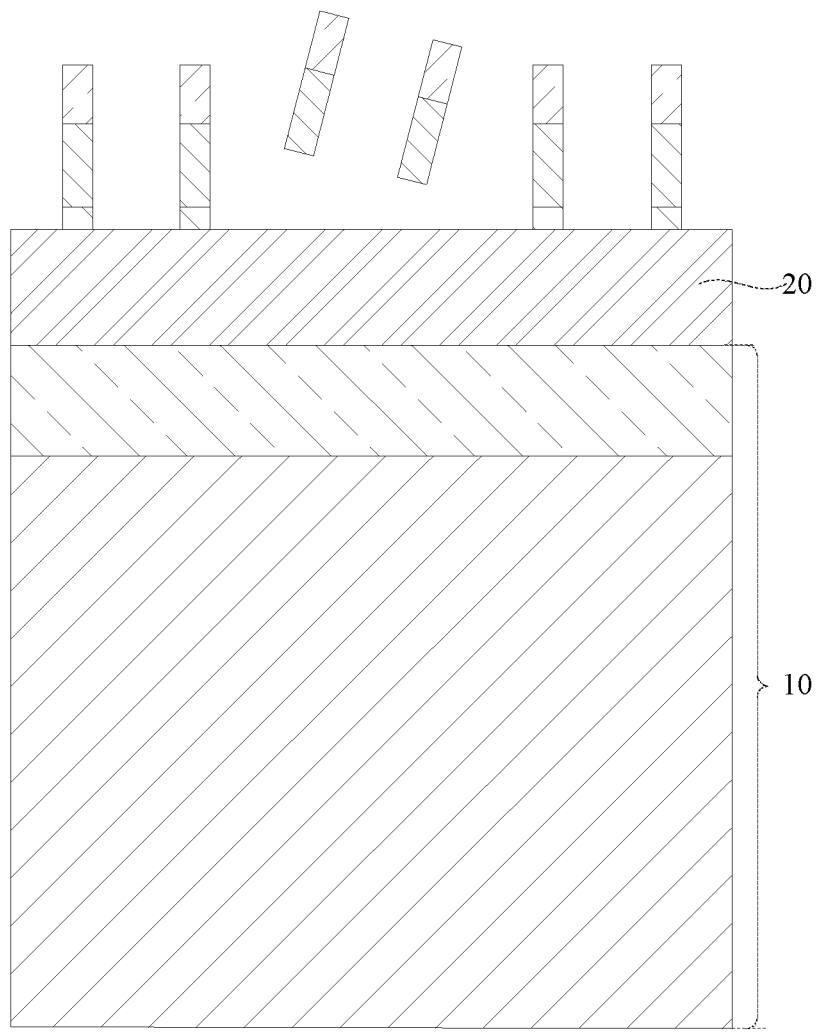
FIG. 3 illustrates a schematic view of laterally etching the native oxide in the method for manufacturing the semiconductor structure according to the embodiments of the disclosure.
Figure 4:
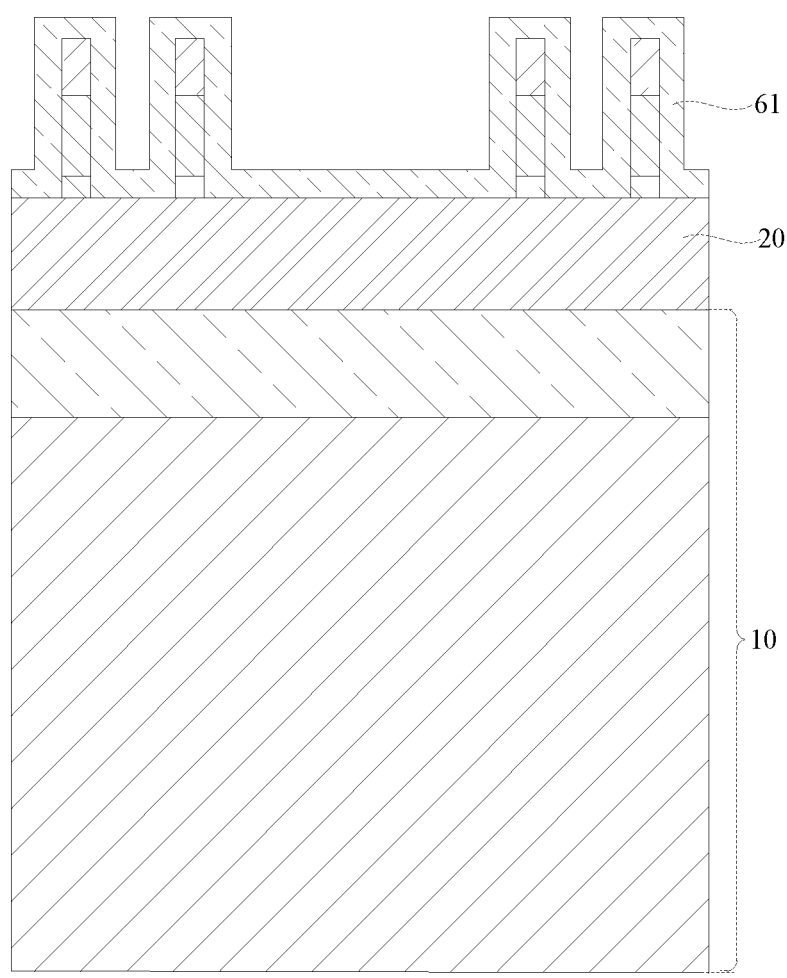
FIG. 4 illustrates a schematic view of forming a silicon dioxide layer in the method for manufacturing a semiconductor structure according to the embodiments of the disclosure.
Figure 5:
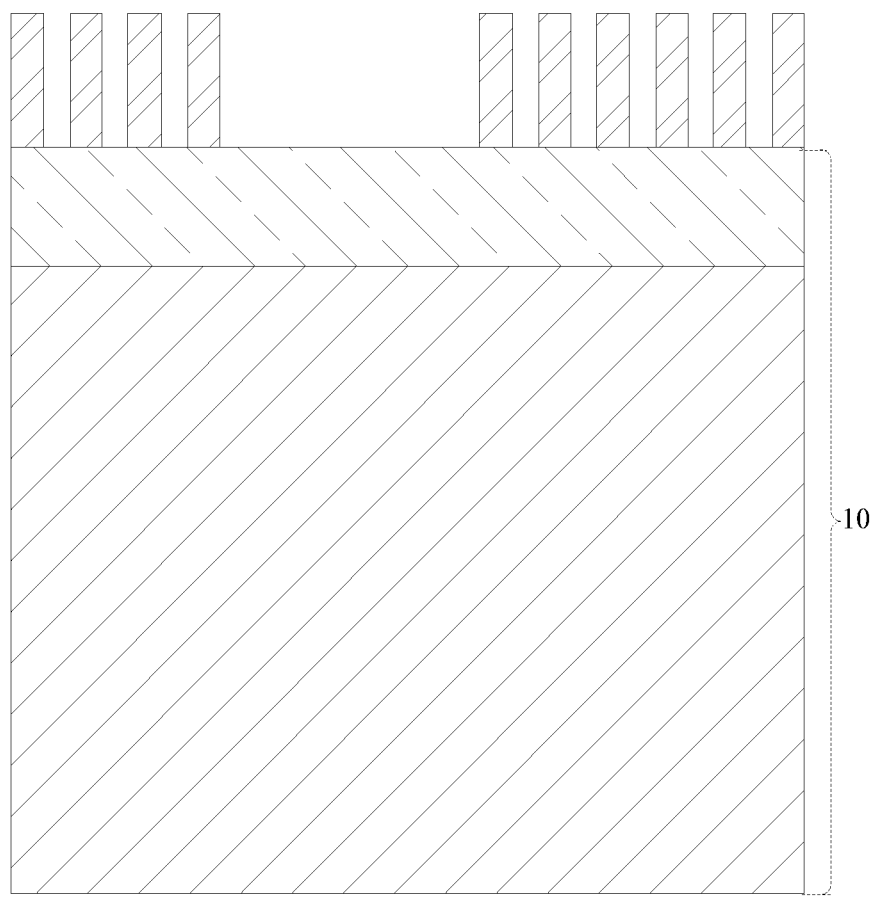
FIG. 5 illustrates a schematic view of patterning a polysilicon layer in a method for manufacturing a semiconductor structure according to the embodiments of the disclosure.

As described in the BACKGROUND, in the case that a mask layer or a film layer includes a polysilicon layer, a surface of the polysilicon layer can be easily oxidized into a native oxide. The etching rate of the native oxide is relatively high, so the native oxide is prone to be etched laterally when the mask layer or the film layer is patterned subsequently, which renders a mask pattern fragmentary and affects the performance of a semiconductor structure.

For example, as shown in FIG. 1 to FIG. 5, when a polysilicon layer 20 serves as a mask layer, a first mask layer 30 usually needs to be formed on the polysilicon layer 20. The first mask layer 30 is patterned, and a pattern of the first mask layer 30 should be transferred to a native oxide 21. Because the etching rate of the native oxide 21 is relatively high, for the same etching gas, the native oxide 21 will be over-etched laterally, which results in the deficiency in part of the native oxide. When the pattern on the native oxide still serves as a mask pattern to continue etching the polysilicon layer 20, the pattern formed on the polysilicon layer 20 will be fragmentary. Then, when the patterned polysilicon layer 20 in turn serves as a mask to continue etching a substrate 10, a trench formed in the substrate 10 will be fragmentary, which reduces the yield of semiconductor structures.

For another example, as shown in FIG. 6 to FIG. 10, in the case that the polysilicon layer 20 serves as a film layer of a semiconductor structure, when the polysilicon layer 20 is patterned, for the same etching gas and the etching rate, the amount of etched native oxide 21 is greater than that of the etched polysilicon layer (because the etching rate of the native oxide 21 is higher than that of the polysilicon layer 20), which results in lack of integrity of the native oxide on the retained polysilicon layer, and then results in that grooves are formed in a top surface of the remaining polysilicon layer in the subsequent operation, thereby affecting the performance of the semiconductor structure.

In a related art, the native oxide is removed by the following two processes. In the first process, the native oxide is removed by HF, and then HF remaining on a surface of a wafer is removed by deionized water. However, during removing the HF by using the deionized water, the surface of the polysilicon layer will be oxidized to form the native oxide again. In the second process, HF gas or ammonia gas are used to react with the native oxide to generate a byproduct (NH4)2SIF6. Then, the byproduct is sublimated and removed by heating. However, the native oxide cannot be removed completely in this removal manner, so that the native oxide with the thickness of about 0.4 to 0.5 nm is still remained on the surface of the polysilicon layer.

In view of the abovementioned technical problems, in the embodiments of the disclosure, the native oxide is nitrogenized into the silicon oxynitride layer. Since the etching rate of the silicon oxynitride layer is lower than that of the native oxide, lateral etching of the silicon oxynitride layer can be avoided in a subsequent etching operation. In this way, the integrity of a pattern on the silicon oxynitride layer is ensured, thus the accuracy of the pattern formed by using the patterned silicon oxynitride layer as a mask is ensured, and the yield of semiconductor structures is improved.

In order to make the abovementioned objectives, features, and advantages of the embodiments of the disclosure more apparent and easier to understand, technical solutions in the embodiments of the disclosure will be clearly and completely described below with reference to the drawings in the embodiments of the disclosure. Apparently, the described embodiments are only part rather than all embodiments of the disclosure. Based on the embodiments in the disclosure, all other embodiments obtained by a person of ordinary skill in the art without creative efforts fall within the scope of protection of the disclosure.

The semiconductor structure in the embodiment is not limited to the examples described herein. The semiconductor structure will be described below by taking a Dynamic Random Access Memory (DRAM) as an example, but the embodiment is not limited thereto. The semiconductor structure in the embodiment may also be other structures.

Figure 11:
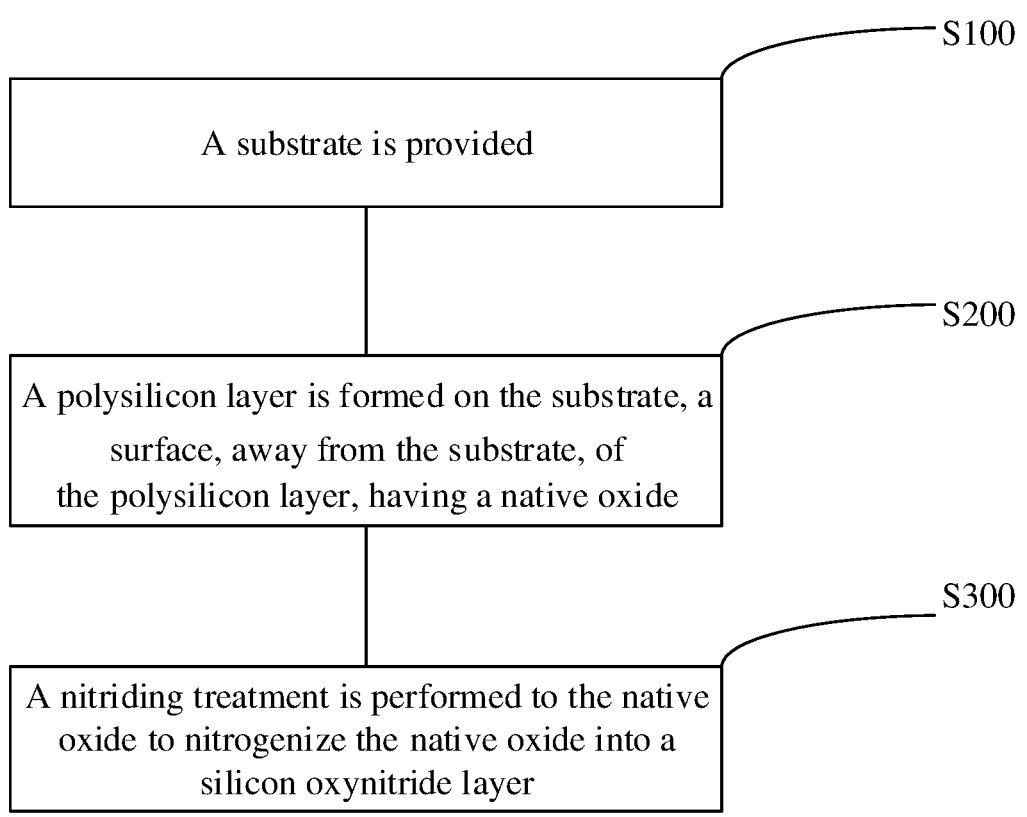
FIG. 11 illustrates a process flowchart of a method for manufacturing a semiconductor structure according to the embodiments of the disclosure.

As shown in FIG. 11, a method for manufacturing a semiconductor structure according to the embodiments of the disclosure includes the following operations.

At S100: a substrate is provided.

In an example, a substrate 10, which serves as a supporting component of a dynamic random access memory, is configured to support other components arranged thereon. The substrate 10 may be made of a semiconductor material. The semiconductor material may be one or more of silicon, germanium, silicon germanium compounds and silicon carbon compounds.

Figure 6:
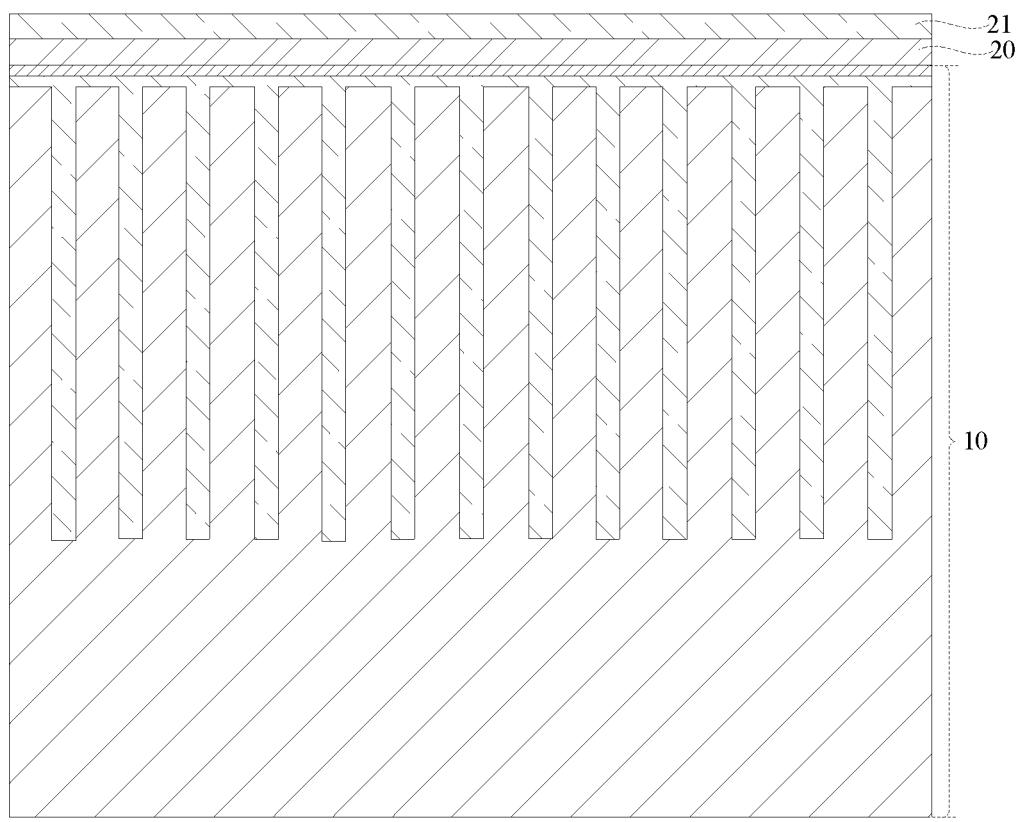
FIG. 6 illustrates a schematic view of forming a native oxide in a method for manufacturing a semiconductor structure according to the embodiments of the disclosure.

Since the structure of the substrate in the present embodiment is the same as the substrate in the related art, the structure thereof may refer to FIG. 1 and FIG. 6.

At S200: a polysilicon layer is formed on the substrate. A surface, away from the polysilicon layer, of the substrate has a native oxide.

In an example, continuing to refer to FIG. 1 and FIG. 6, a polysilicon layer 20 with a certain thickness may be formed on the substrate 10 through a deposition process. After the polysilicon layer 20 is formed, silicon on the surface of the polysilicon layer 20 will react with the oxygen or water existed in a storage environment or a machine table, so as to form a layer of native oxide 21 on the surface of the polysilicon layer 20. The material of the native oxide 21 may include silicon oxide.

Figure 12:
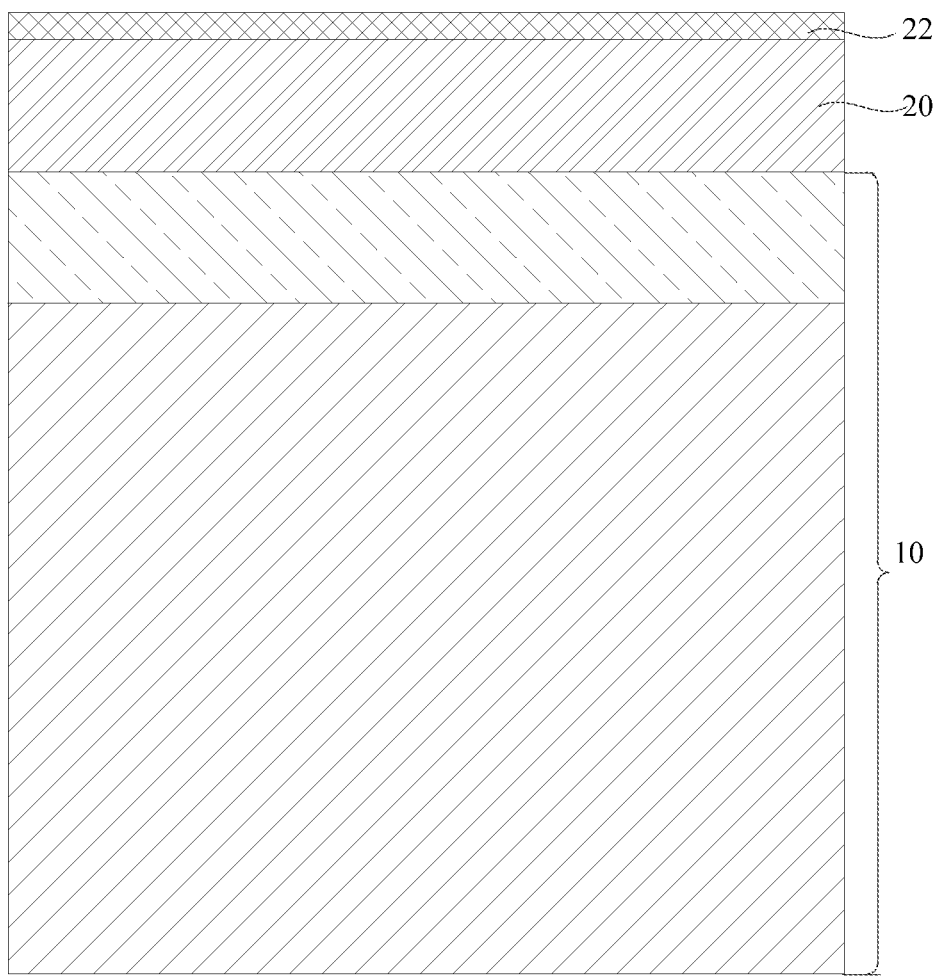
FIG. 12 illustrates a schematic view of forming a silicon oxynitride layer in the method for manufacturing a semiconductor structure according to the embodiments of the disclosure.
Figure 13:
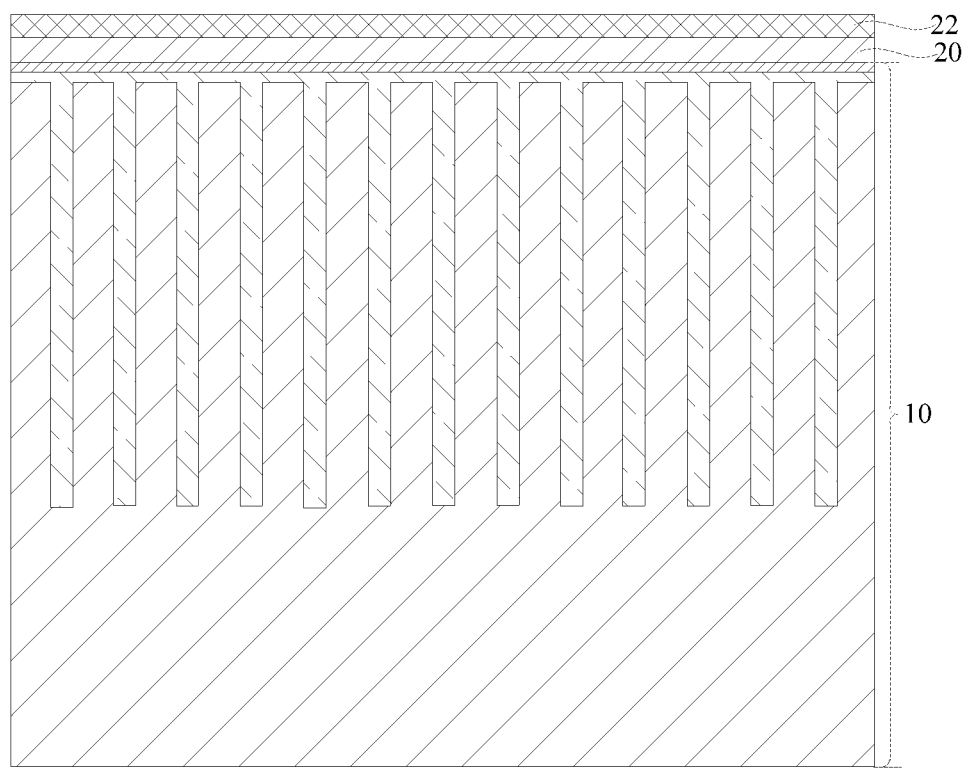
FIG. 13 illustrates a further schematic view of forming the silicon oxynitride layer in the method for manufacturing a semiconductor structure according to the embodiments of the disclosure.

At S300: a nitriding treatment is performed to the native oxide, to nitrogenize native oxide into a silicon oxynitride layer. The structure of the silicon oxynitride layer is as shown in FIG. 12 and FIG. 13.

In an example, nitrogen-containing gas is introduced into a deposition device, and then the nitrogen-containing gas forms nitrogen-containing plasma by a plasma processor. The nitrogen-containing plasma will penetrate into the native oxide 21, to form a silicon oxynitride layer 22 rich in nitrogen. Compared with the native oxide, the hardness of the silicon oxynitride layer 22 is relatively high, and thus the etching rate of the silicon oxynitride layer 22 is lower than that of the native oxide. During subsequent etching of the silicon oxynitride layer, lateral etching of the silicon oxynitride layer can be avoided, and the integrity of a pattern formed on the silicon oxynitride layer can be ensured.

It should be noted that the etching rate may be defined as a speed of removing a certain material during etching.

The nitrogen-containing gas may include $NH_3$ and $N_2O$, or the nitrogen-containing gas may include $NH_3$ and $N_2$, or the nitrogen-containing gas may include $H_2N_2$.

In the nitriding treatment of the native oxide and during the plasma ionization, the source radio frequency power is 1500 to 2000 W, the pressure is 0.1 to 0.5 Torr, and the treatment temperature is 450 to 600° C.

Due to different components in different nitrogen-containing gases, the flow rates of different nitrogen-containing gases need to be controlled. For example, if the nitrogen-containing gas is $NH_3$ and $N_2O$ or the nitrogen-containing gas includes $NH_3$ and $N_2$, the flow rate of NH3 is 450 to 700 sccm, and the flow rate of the $N_2O$ or $N_2$ is 200 to 300 sccm. If the nitrogen-containing gas is $H_2N_2$, the flow rate of the $H_2N_2$ is 1300 to 2000 sccm.

After the polysilicon layer is formed on the substrate, and before the native oxide is nitrogenized, the manufacture method further includes operation of measuring the thickness of the native oxide through a measurement device.

In the present embodiment, the thickness of the native oxide 21 may be measured before the native oxide is nitrogenized, and then the nitriding time is adjusted according to the thickness of the native oxide 21, so as to ensure a nitriding effect.

In an example, the nitriding time for per 0.1 nm thickness of the native oxide is 0.4 to 0.44 s. After the thickness of the native oxide 21 is known, the required nitriding time can be calculated according to the thickness of the native oxide, which provides theoretical support for ensuring the nitriding effect.

In order to ensure that the native oxide can be completely nitrogenized, the nitriding time may be increased properly on the basis of the abovementioned nitriding time. For example, the nitriding time may be increased by 10 s to 20 s.

Further, the thickness of the silicon oxynitride layer may also be measured by a measurement device after the native oxide is nitrogenized. The nitriding effect is characterized by the thickness of the silicon oxynitride layer, and theoretical support is provided for a subsequent operation of removing the silicon oxynitride layer.

It should be noted that the polysilicon layer in the embodiments of the disclosure may function as a pattern transferring layer, and may be configured to transfer the pattern on the mask layer to the substrate; or the polysilicon layer may function as a certain film layer (for example, a bit line contact layer.) of the semiconductor structure The operations of manufacture method after the native oxide is nitrogenized may also be variable depending on the function of the polysilicon layer, which will be described in detail below.

In a feasible embodiment, as shown in FIG. 14 to FIG. 18, a first mask layer 30 and a first photoresist layer 40 having a mask pattern are formed on the silicon oxynitride layer 22.

Figure 14:
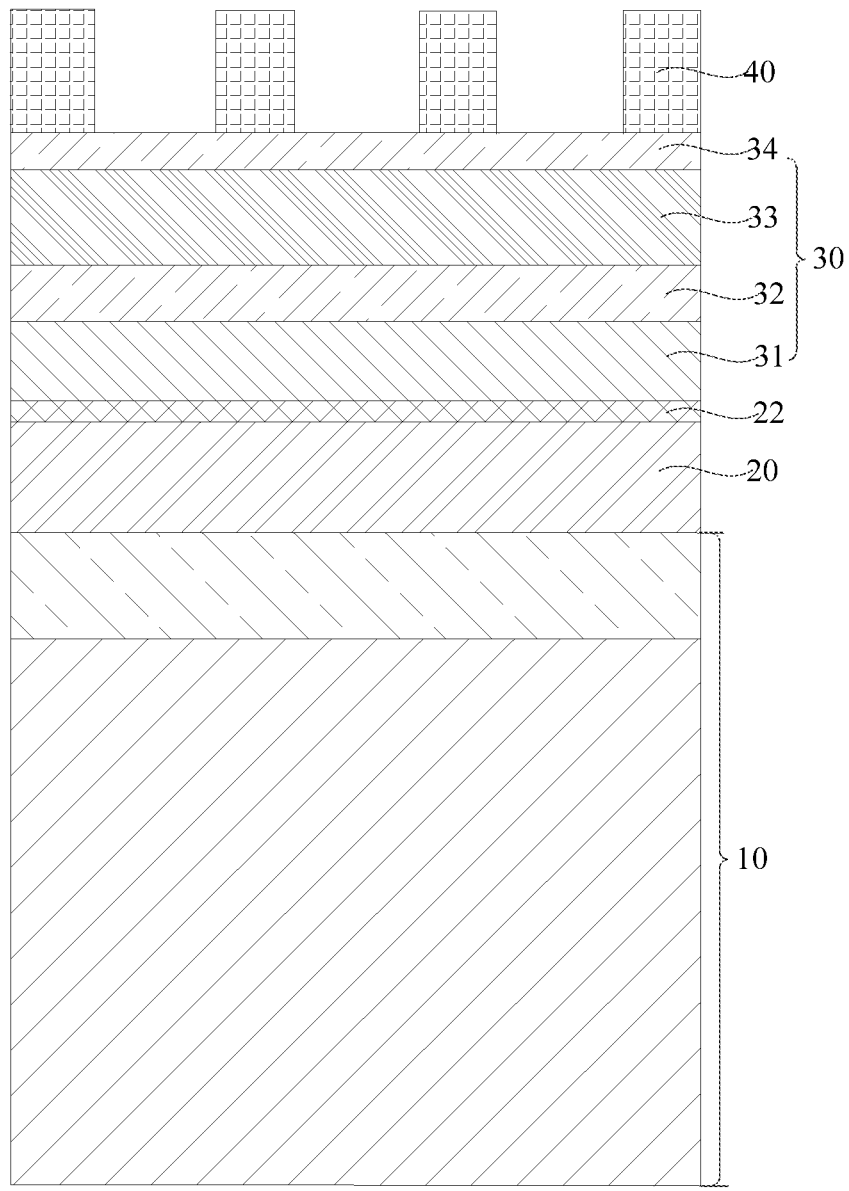
FIG. 14 illustrates a schematic view of forming a first mask layer in the method for manufacturing a semiconductor structure according to the embodiments of the disclosure.

In an example, as shown in FIG. 14, the first mask layer 30 may be formed on the silicon oxynitride layer 22 through a deposition process. The first mask layer 30 may be a single film layer, or may be a composite film layer. If the first mask layer 30 is the composite film layer, the first mask layer 30 may include a carbon layer 31, a first silicon nitride layer 32, a first hard mask layer 33 and a second silicon nitride layer 34. The carbon layer 31 is arranged on the silicon oxynitride layer 22.

After the second silicon nitride layer 34 is formed, the first photoresist layer 40 may be formed on the second silicon nitride layer 34 by coating.

Then, the first photoresist layer 40 is patterned by exposure, development or etching, to form the first photoresist layer 40 having the mask pattern.

Figure 15:
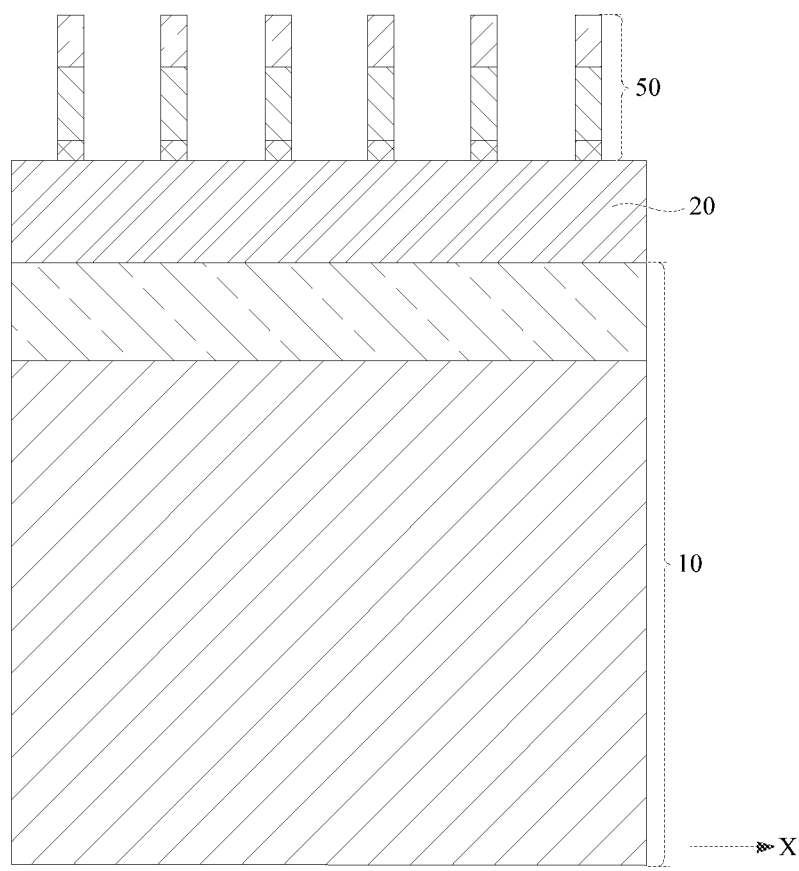
FIG. 15 illustrates a schematic view of forming a mask bump in the method for manufacturing a semiconductor structure according to the embodiments of the disclosure.

As shown in FIG. 15, after the first photoresist layer 40 having the mask pattern is formed, a part of the first mask layer 30 and a part of the silicon oxynitride layer 22 may be removed by using the first photoresist layer 40 as a mask, so as to form a plurality of mask bumps 50 arranged at equidistant intervals. The distance between every two adjacent mask bumps 50 is constant.

In the present embodiment, the first mask layer 30 is a composite film layer. In a process of transferring a pattern, the second silicon nitride layer 34 is etched by using the first photoresist layer 40 having the mask pattern as a mask, so as to form the second silicon nitride layer 34 having a pattern; then, the first hard mask layer 33, the second silicon nitride layer 34 having the pattern is utilized for etching the first silicon nitride layer 32 and the carbon layer 31 in sequence, so as to transfer the pattern on the second silicon nitride layer 34 to the carbon layer 31; and then, the silicon oxynitride layer 22 is etched by using the carbon layer 31 having the pattern as a mask, so as to transfer the pattern to the silicon oxynitride layer 22 finally.

Through pattern transferring processes, the accuracy of the pattern finally transferred to the silicon oxynitride layer can be guaranteed.

In the present embodiment, the native oxide is nitrogenized to convert the native oxide into the silicon oxynitride layer. The silicon oxynitride layer 22 will not be laterally etched when the mask pattern on the first photoresist layer 40 is transferred on the silicon oxynitride layer 22 because the etching rate of the silicon oxynitride layer is lower than the etching rate of the native oxide, so that the retained first mask layer 30 and the silicon oxynitride layer 22 form a plurality of mask bumps 50. A plurality of mask bumps are arranged at equidistant intervals in X-direction in FIG. 15, and the distance between two adjacent mask bumps 50 is constant. That is to say, the horizontal distance between every two adjacent mask bumps 50 in the X-direction is the same, so that the lack of integrity of part of the native oxide in the formed mask bumps 50 in the related art is avoided, the lack of integrity of part of the mask bumps 50 is avoided, and then the lack of integrity of the pattern formed when the mask bumps are used as a mask can be prevented, and the yield of the semiconductor structure can be guaranteed.

In some embodiments, after the first photoresist layer 40 is used as a mask, the method for manufacturing the semiconductor structure further includes the following operations.

A mask strip 60 is formed on a side wall of each of the mask bumps 50. A top surface of the mask strip 60 is flush with a top surface of the mask bump 50.

Figure 16:
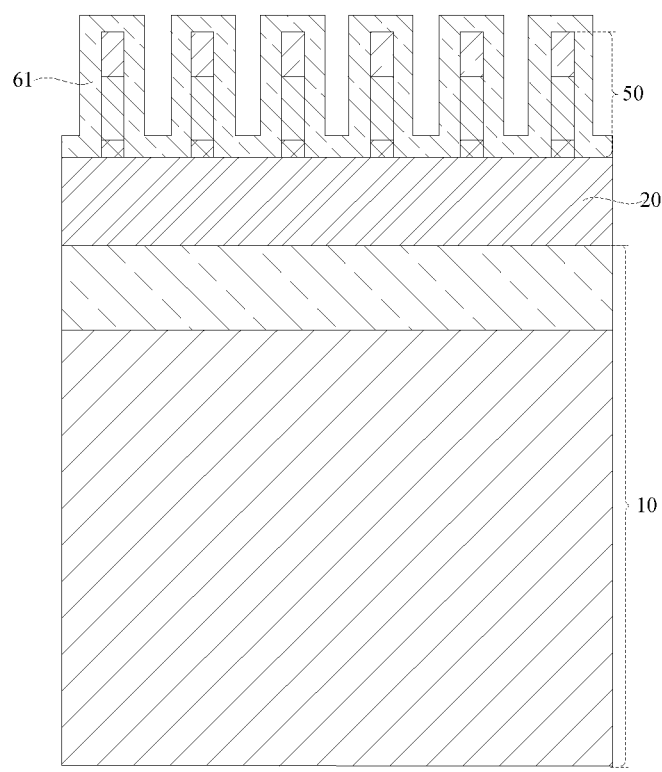
FIG. 16 illustrates a schematic view of forming a silicon oxide layer in the method for manufacturing a semiconductor structure according to the embodiments of the disclosure.

In an example, as shown in FIG. 16, a silicon dioxide layer 61 may be formed on a top surface of the polysilicon layer 20 between the adjacent mask bumps 50, side surfaces and top surfaces of the mask bumps 50 by an atomic layer deposition process.

Portions of the silicon dioxide layer 61 located on the top surface of the polysilicon layer 20 and the top surfaces of the mask bumps 50 are removed, and portions of the silicon dioxide layer located on the side surfaces of the mask bumps 50 are retained. The retained silicon dioxide layers form the mask strips 60.

Figure 17:
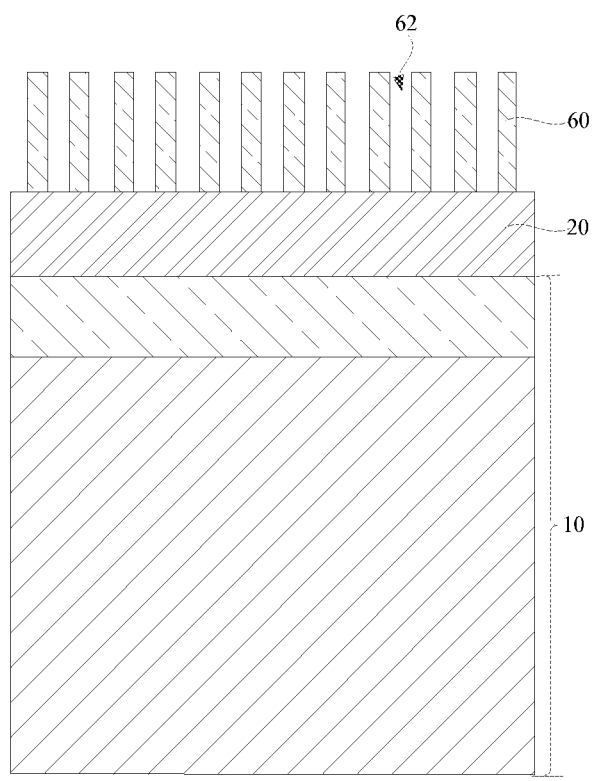
FIG. 17 illustrates a schematic view of forming a mask strip in the method for manufacturing a semiconductor structure according to the embodiments of the disclosure.

After the mask strips are formed, as shown in FIG. 17, the mask bumps 50 may be removed by an etching solution, the mask strips 60 may be retained, and a first opening 62 may be formed between adjacent mask strips 60.

In view of the abovementioned process, the thickness of the silicon oxynitride layer 22 is measured by the thickness measuring device. Therefore, the concentration and the dosage of the etching solution may be adjusted according to the thickness of the silicon oxynitride layer 22, so as to ensure that the mask bumps 50 can be removed without damaging the mask strips 60.

The etching solution may include HF.

Figure 18:
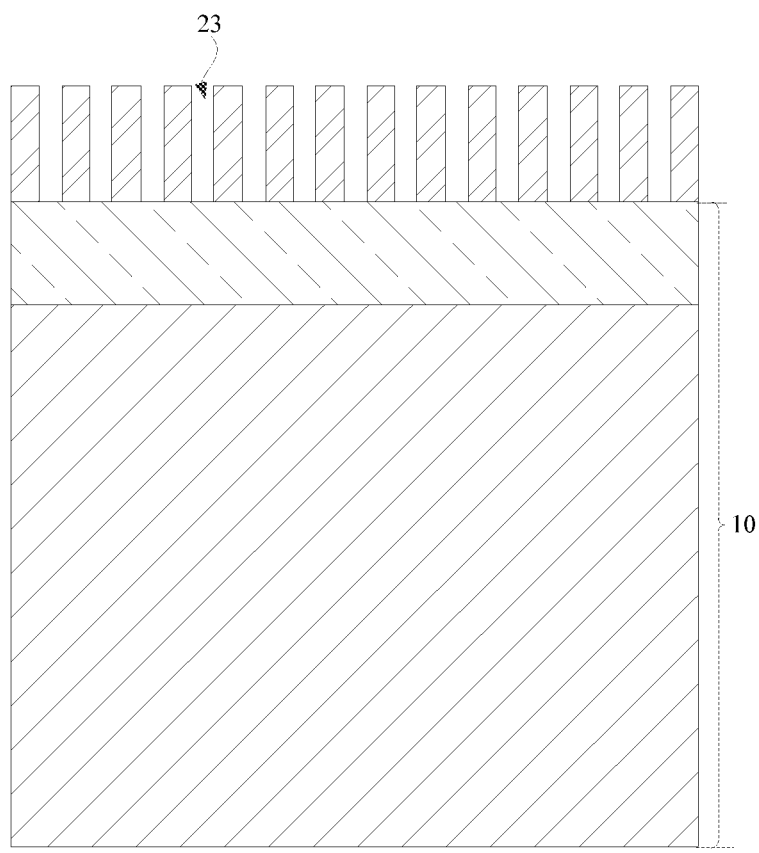
FIG. 18 illustrates a schematic view patterning the polysilicon layer in the method for manufacturing a semiconductor structure according to the embodiments of the disclosure.

As shown in FIG. 18, a portion of the polysilicon layer 20 exposed from the first opening 62 is removed by the etching solution or the etching gas, so as to form a plurality of second openings 23 arranged at intervals in the polysilicon layer 20.

Figure 19:
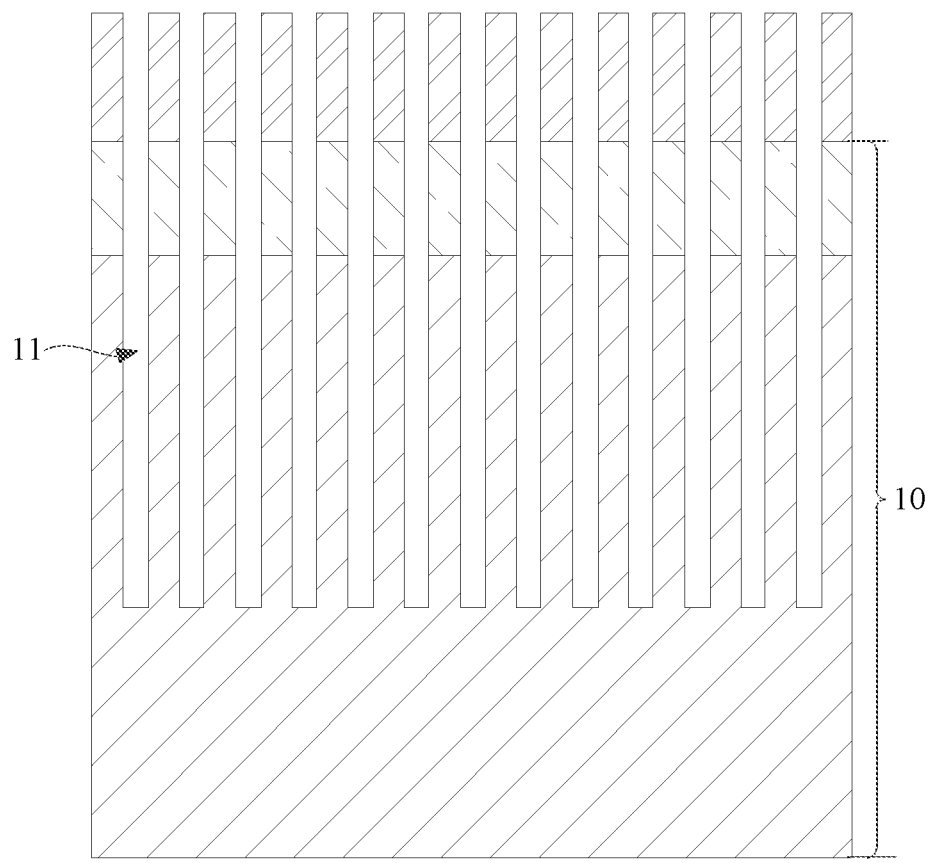
FIG. 19 illustrates a schematic view of forming a trench in the method for manufacturing a semiconductor structure according to the embodiments of the disclosure.

As shown in FIG. 19, after the second openings 23 are formed, the substrate 10 exposed form the second opening 23 is removed, so as to form, in the substrate 10, a plurality of trenches 11 at equidistant intervals.

It should be noted that, after the trenches 11 are formed, a subsequent process operation may be performed according to a specific structure of the semiconductor structure. For example, if the trench 11 is configured to form a shallow trench isolation structure 12, an insulating material deposited into the trench 11 by a deposition process to form the shallow trench isolation structure 12. The insulating material may include silicon oxide.

For another example, the trench 11 may be configured to form an embedded gate structure. In this case, a gate oxide layer may be formed on an inner wall of the trench 11, and then a conductive layer may be formed in an area surrounded by the gate oxide layer, in which a top surface of the conductive layer is lower than a top surface of the substrate.

Figure 20:
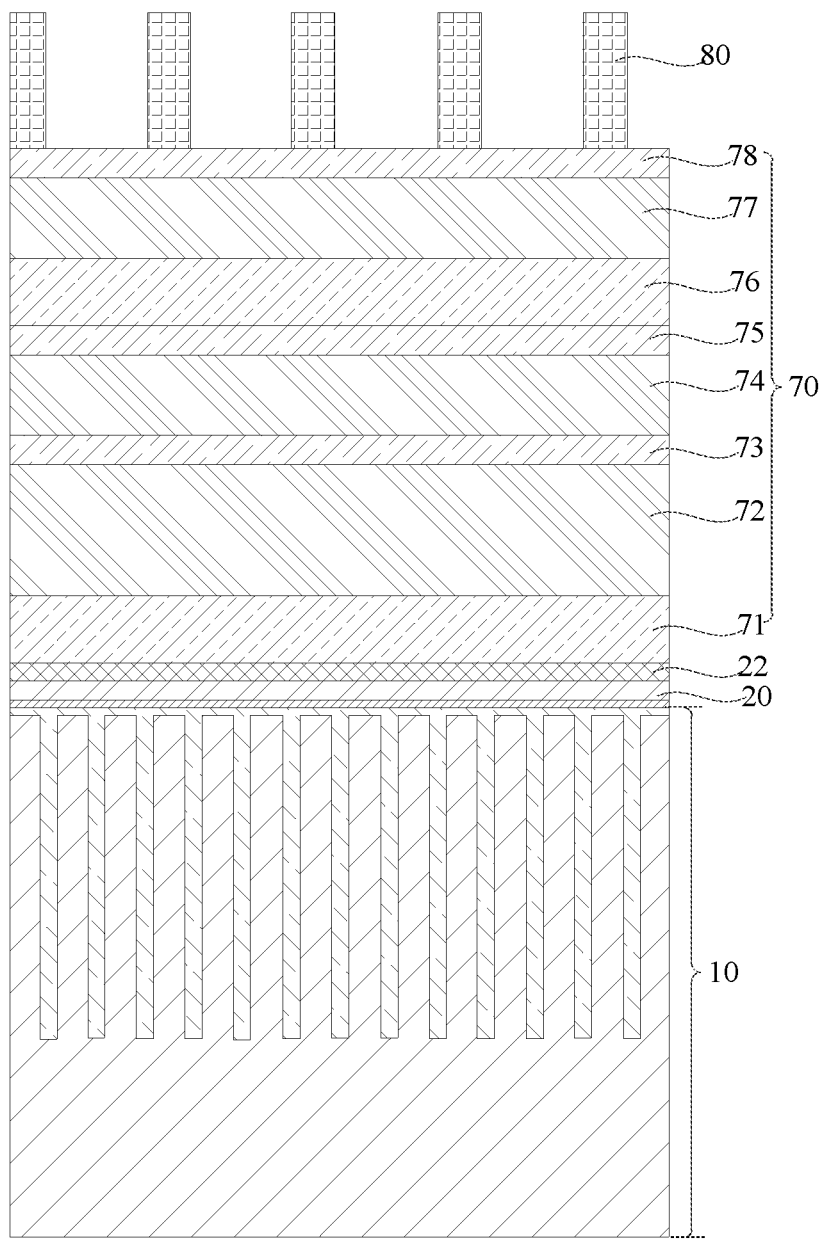
FIG. 20 illustrates a schematic view of forming a second mask layer in a method for manufacturing a semiconductor structure according to the embodiments of the disclosure.

In another feasible embodiment, as shown in FIG. 20, a second mask layer 70 and a second photoresist layer 80 having a mask pattern are formed on the silicon oxynitride layer 22.

In one example, the second mask layer 70 may be formed on the silicon oxynitride layer 22 through a deposition process. The second mask layer 70 is a composite film layer. For example, the second mask layer 70 may successively include a first oxide layer 71, a second hard mask layer 72, a third silicon nitride layer 73, a third hard mask layer 74, a fourth silicon nitride layer 75, a second oxide layer 76, a fourth hard mask layer 77, and a fifth silicon nitride layer 78 that are stacked one above another. The first oxide layer 71 is arranged on the silicon oxynitride layer 22.

After the fifth silicon nitride layer 78 is formed, the second photoresist layer 80 may be formed on the fifth silicon nitride layer 78 by coating.

Then, the second photoresist layer 80 is patterned by exposure, development, or etching, so as to form the second photoresist layer 80 having a mask pattern.

Figure 21:
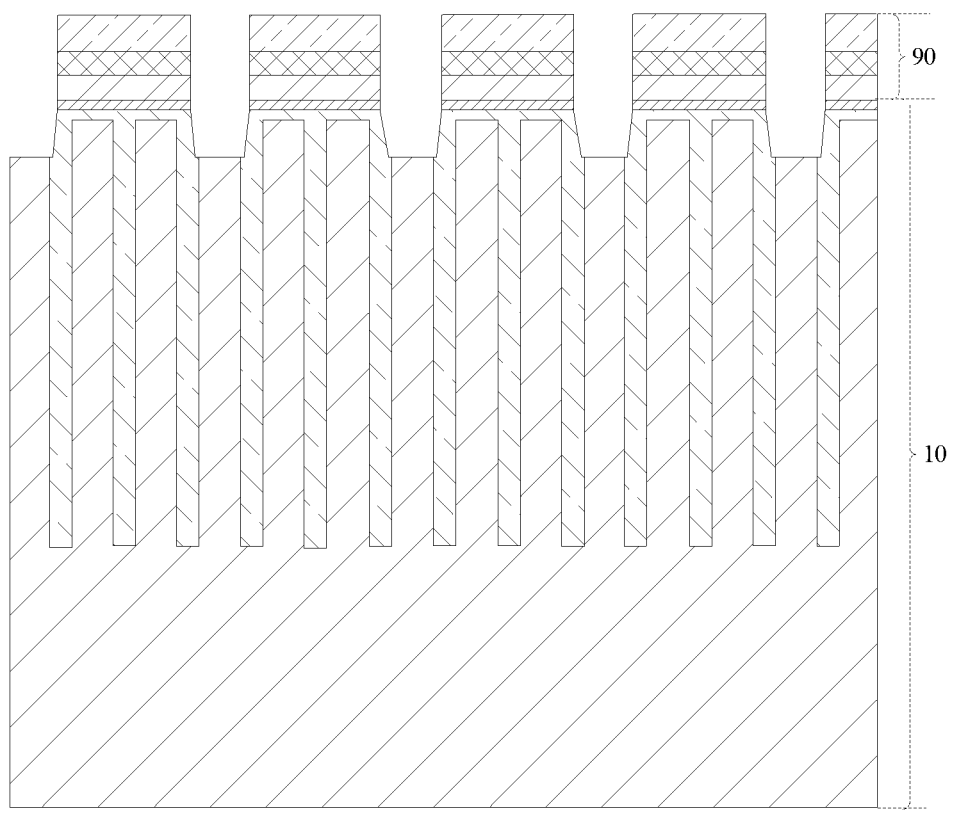
FIG. 21 illustrates a schematic view of forming a bump in the method for manufacturing a semiconductor structure according to the embodiments of the disclosure.

As shown in FIG. 21, after the second photoresist layer 80 having the mask pattern is formed, a part of the second mask layer 70, a part of the silicon oxynitride layer 22, and a part of the substrate 10 may be removed by using the second photoresist layer 80 as a mask, so as to form a plurality of mask bumps 90 arranged at intervals. Top surfaces of the plurality of mask bumps 90 are flush with one another.

In the present embodiment, the second mask layer 70 is a composite film layer. In a process of transferring a pattern, the fifth silicon nitride layer 78 is etched by using the second photoresist layer 80 having the mask pattern as a mask, so as to form the fifth silicon nitride layer 78 having the pattern; then, the remaining film layers of the second mask layer 70 are etched in sequence by using the fifth silicon nitride layer 78 having the pattern as a mask, so as to transfer the pattern to the first oxide layer 71; and then, the silicon oxynitride layer 22 is etched by using the first oxide layer 71 having the pattern as a mask, so as to transfer the pattern to the silicon oxynitride layer 22 finally.

Through pattern transferring processes, the accuracy of the pattern finally transferred to the silicon oxynitride layer can be guaranteed.

Finally, a part of the substrate 10 is etched by using the silicon oxynitride layer as a mask, so as to form the structure as shown in FIG. 21.

Figure 7:
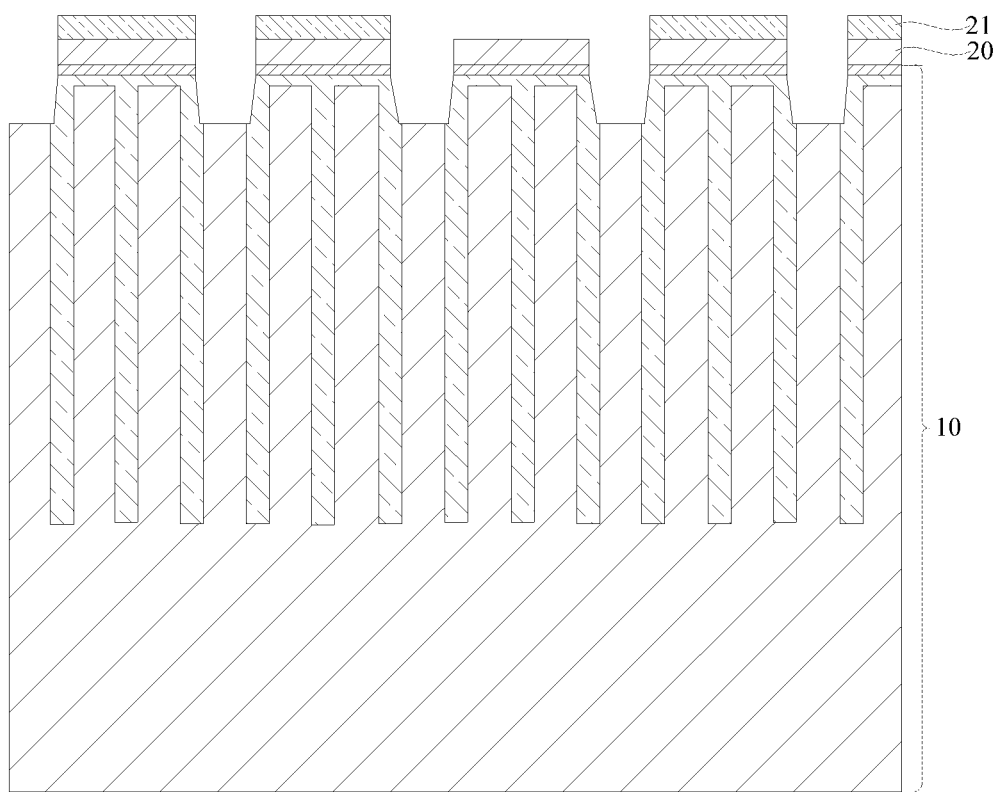
FIG. 7 illustrates a schematic view of patterning the native oxide and the polysilicon layer in a method for manufacturing a semiconductor structure according to the embodiments of the disclosure.
Figure 8:
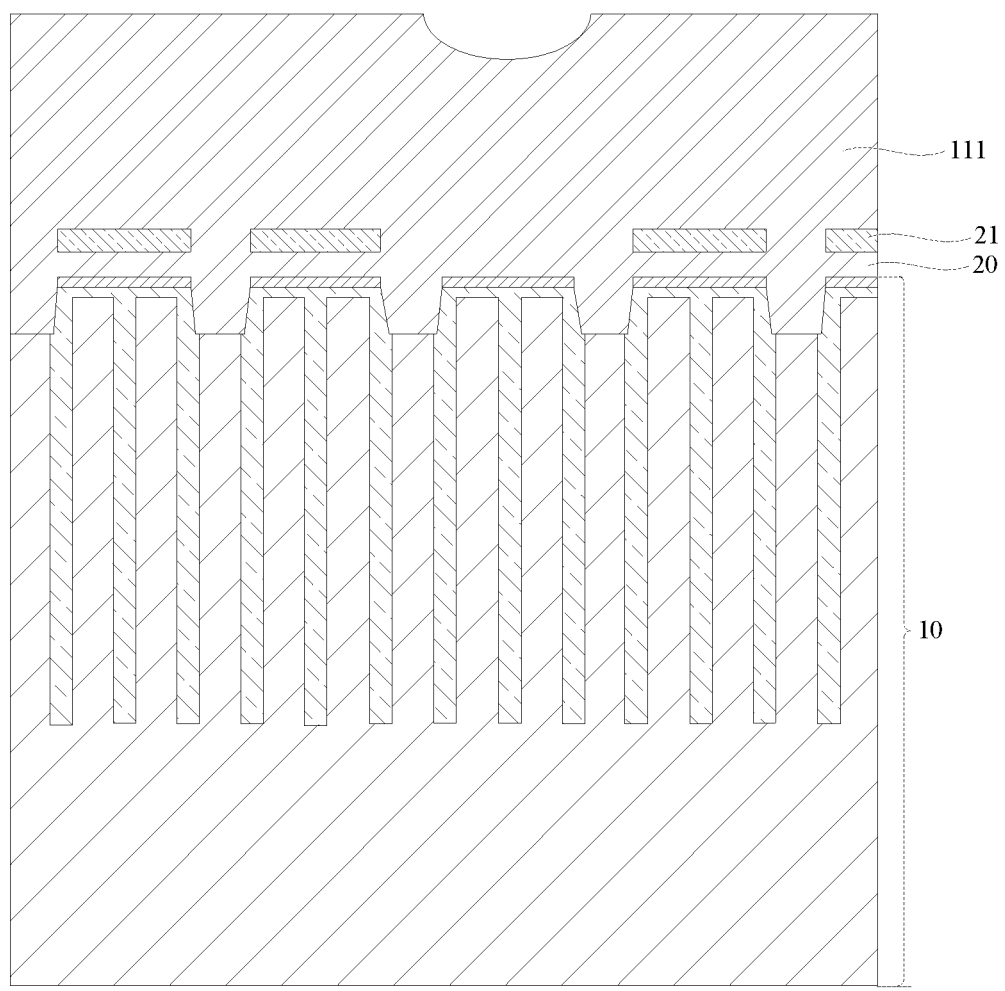
FIG. 8 illustrates a schematic view of forming an initial conductive layer in a method for manufacturing a semiconductor structure according to the embodiments of the disclosure.
Figure 9:
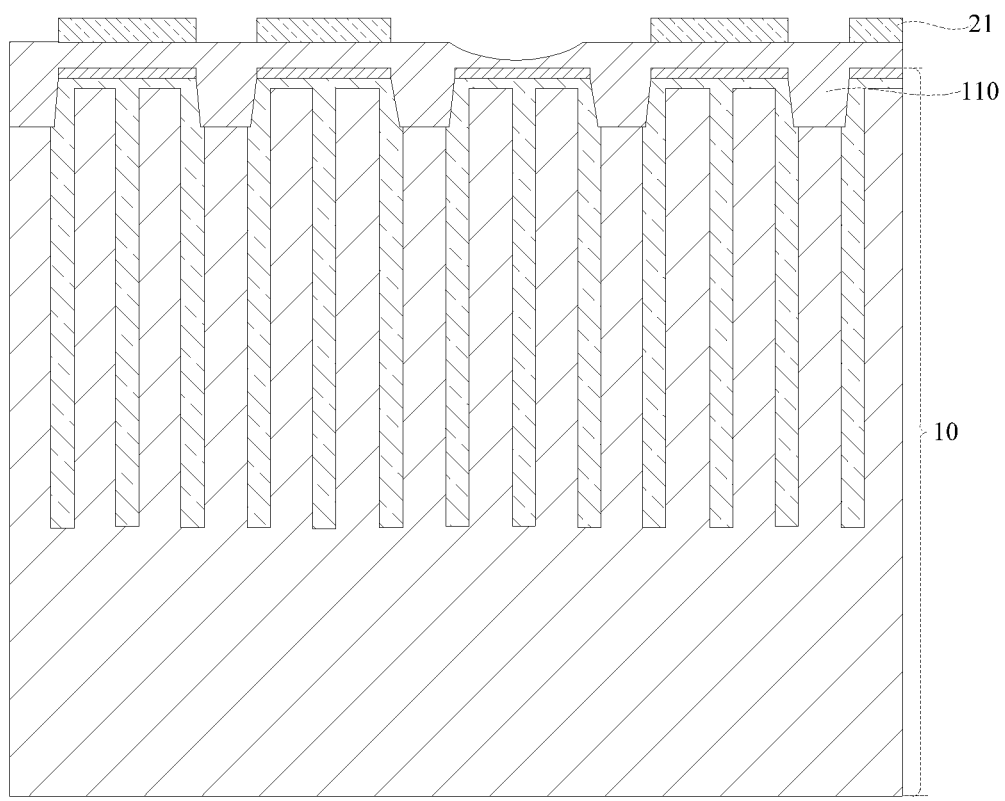
FIG. 9 illustrates a schematic view of forming a conductive layer in a method for manufacturing a semiconductor structure according to the embodiments of the disclosure.
Figure 10:
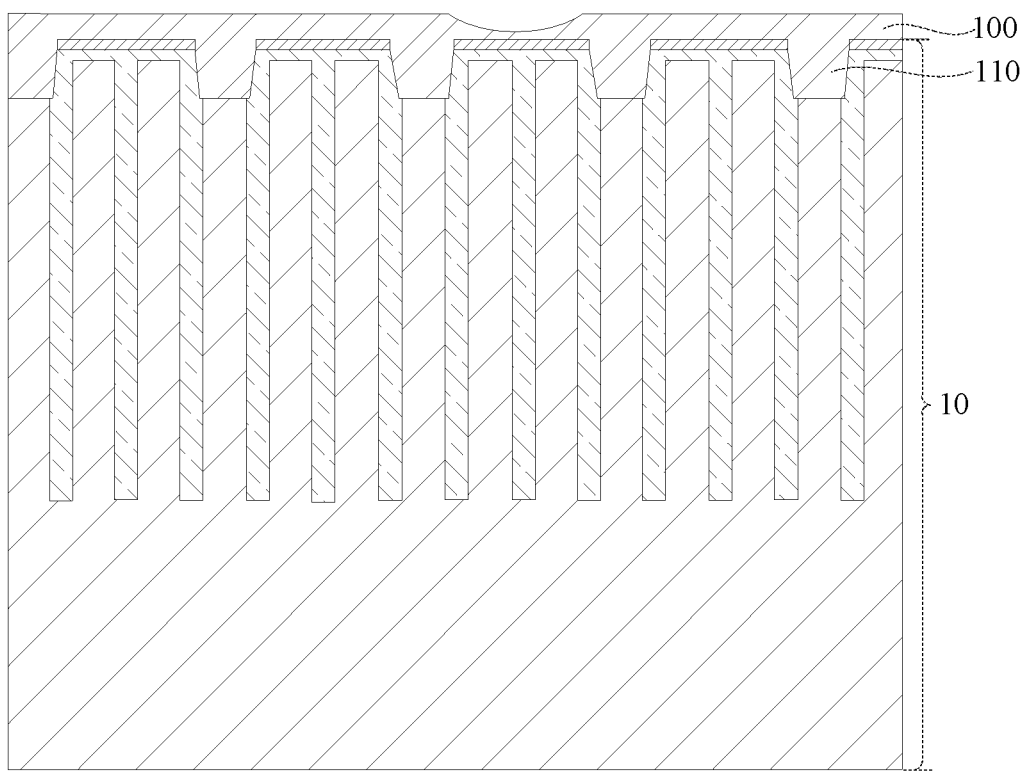
FIG. 10 illustrates a schematic view of removing the remaining native oxide in the method for manufacturing a semiconductor structure according to the embodiments of the disclosure.

In the present embodiment, the native oxide is nitrogenized, and converted into the silicon oxynitride layer. Since the etching rate of the silicon oxynitride layer is lower than that of the native oxide, the silicon oxynitride layer 22 will not be laterally etched when the mask pattern of the second photoresist layer 80 is transferred to the silicon oxynitride layer 22. Compared with the related art as shown in FIG. 7, the retained silicon oxynitride layer 22 in the present application is intact, which ensures that the retained silicon oxynitride layer 22 forms a plurality of bumps 90 arranged at intervals, and the top surfaces of the bumps 90 are flush with each other.

In the present embodiment, the polysilicon layer can sever as an initial film layer of a part of a bit line contact layer, and the retained polysilicon layer may sever as a part of the bit line contact layer. In this case, the embodiment has the following beneficial effects: since the etching rate of the silicon oxynitride layer 22 is relatively low, it is possible to ensure the integrity of the retained silicon oxynitride layer 22, so as to prevent the shape of the retained polysilicon layer from being abnormal, and ensure the integrity of the bit line contact structure, thereby improving the performance of the semiconductor structure.

After the bumps 90 are formed, a conductive layer 110 is formed between the adjacent bumps 90. A top surface of the conductive layer 110 is flush with a top surface of the polysilicon layer 20, and a vertical distance between the top surface of the conductive layer 110 and a bottom surface of the substrate 10 is a fixed value. The top surface of the conductive layer 110 is parallel with the top surface of the substrate 10.

Figure 22:
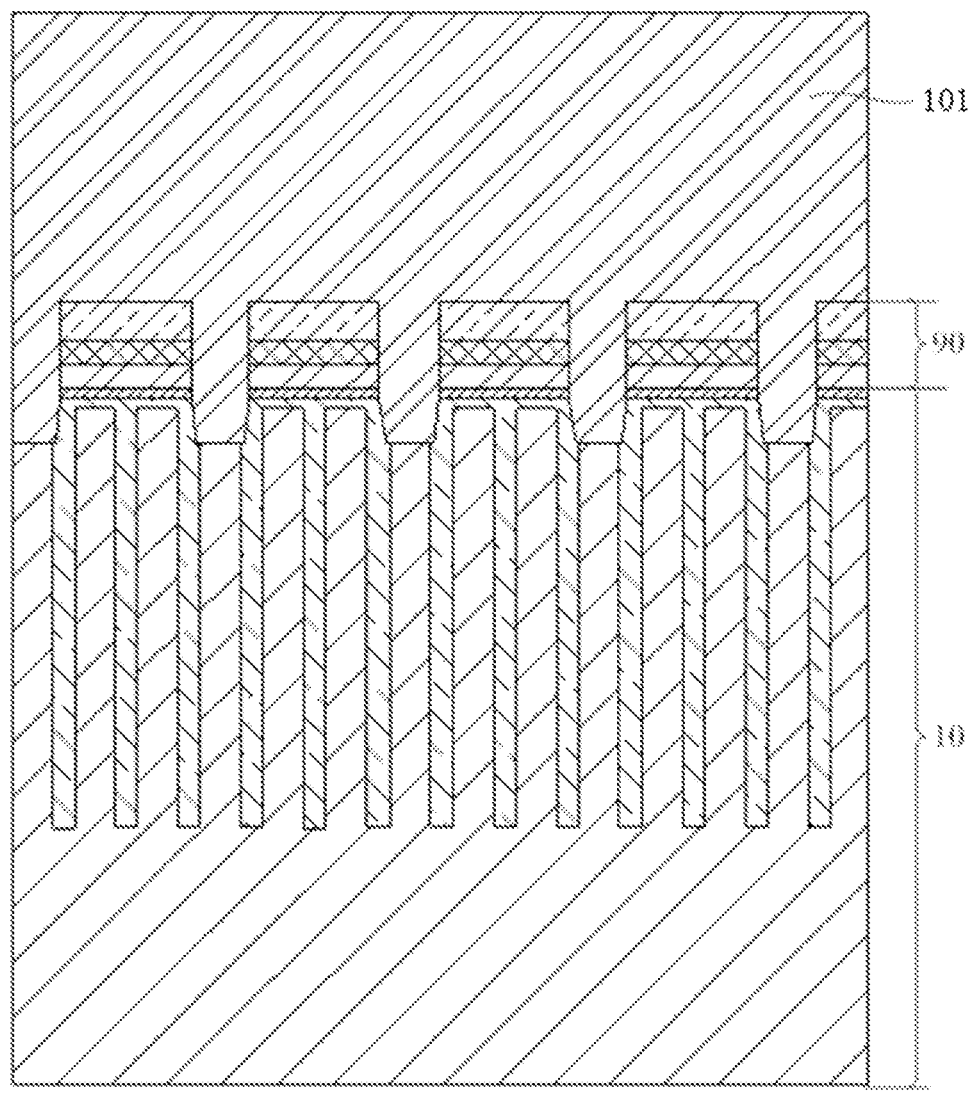
FIG. 22 illustrates a schematic view of forming the initial conductive layer in the method for manufacturing a semiconductor structure according to the embodiments of the disclosure.

In one example, as shown in FIG. 22, an initial conductive layer 101 is formed between the adjacent bumps 90. The initial conductive layer 101 covers the top surface of each bump 90.

Figure 23:
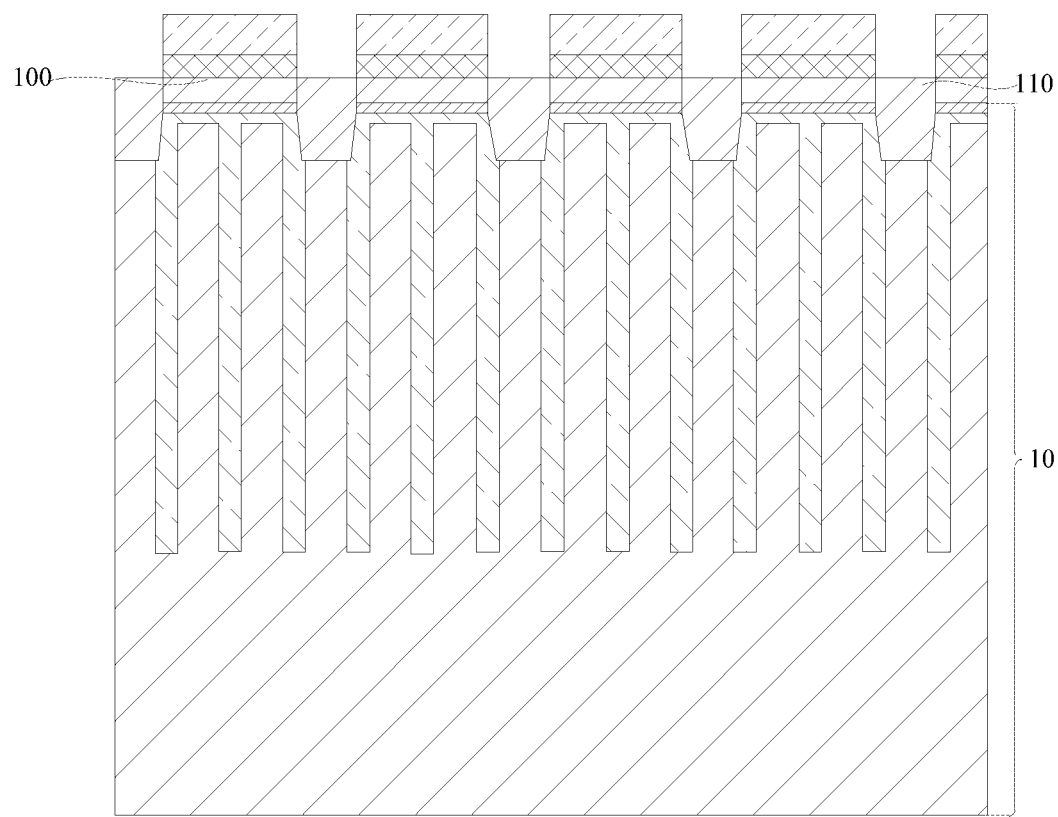
FIG. 23 illustrates a schematic view of forming the initial conductive layer in the method for manufacturing a semiconductor structure according to the embodiments of the disclosure.

Then, as shown in FIG. 23, a portion of the initial conductive layer 101 located above a top surface of the bump 90 is removed, and a portion of the initial conductive layer 101 located between the adjacent bumps 90 is partially removed. The retained initial conductive layer 101 forms the conductive layer 110. The conductive layer 110 may serve as another part of the bit line contact layer. The conductive layer 110 and the retained polysilicon layer form the bit line contact layer as a whole.

Figure 24:
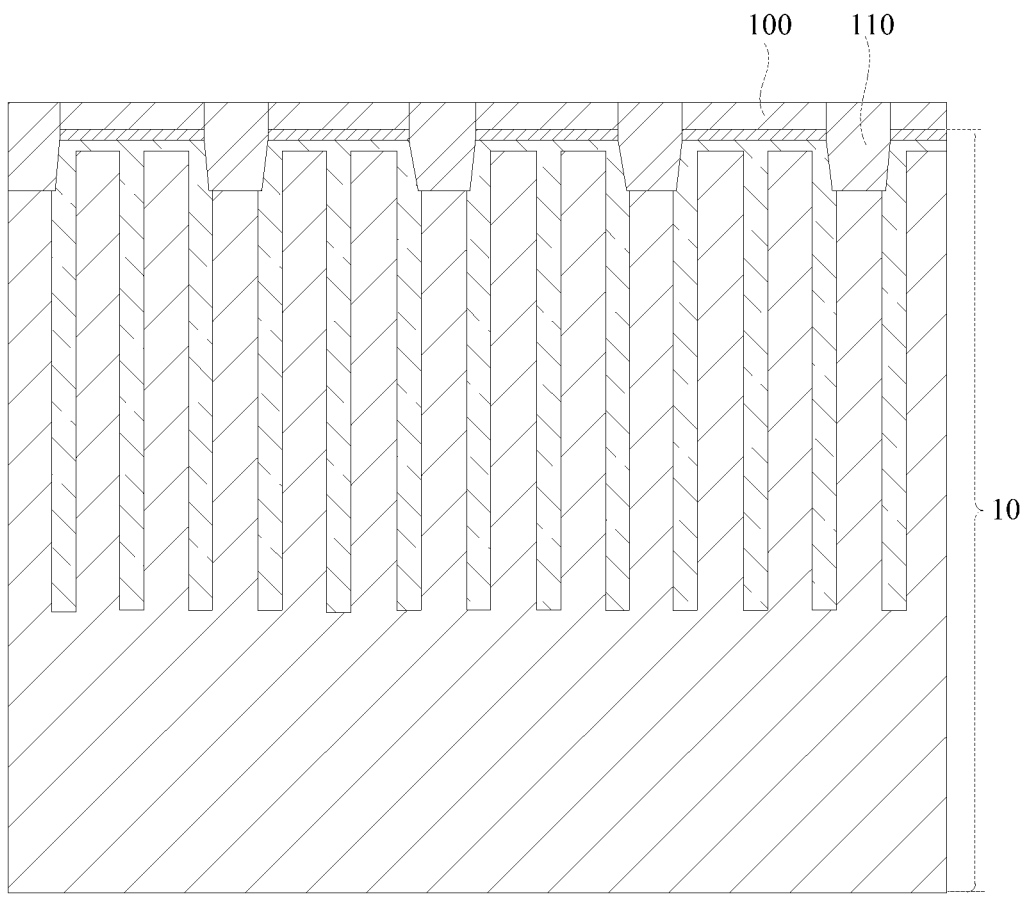
FIG. 24 illustrates a schematic view of removing the silicon oxynitride layer in the method for manufacturing a semiconductor structure according to the embodiments of the disclosure.

As shown in FIG. 24, after the conductive layer 110 is formed, the residue of the silicon oxynitride layer 22 may be removed by HF. It is to be noted that, in the present embodiment, the silicon oxynitride layer 22 may also be removed by other etching gases or etching solutions.

Then, a bit line may be formed on the bit line contact layer by a conventional process.

The embodiments of the disclosure further provide a semiconductor structure. The semiconductor structure is prepared by the method for manufacturing the semiconductor structure in the abovementioned embodiments. Therefore, the semiconductor structure has the beneficial effects in the abovementioned embodiments. The embodiment will not be elaborated herein.

Various embodiments or implementation modes in the specification are described in a progressive mode. Each embodiment focuses on differences from other embodiments, and the same and similar parts of various embodiments may be referred to one another.

In the description of the specification, the description referring to the terms "one embodiment", "some embodiments", "schematic implementation mode", "example", "specific example", or "some examples" means that the specific features, structures, materials, or characteristics described in combination with the implementation modes or examples are included in at least one embodiment or example of the disclosure.

In the specification, the schematic representation of the above terms does not necessarily mean the same implementation mode or example. Furthermore, the specific features, structures, materials, or characteristics described may be combined in an appropriate mode in any one or more implementation modes or examples.

Finally, it should be noted that the foregoing embodiments are merely intended for describing the technical solutions of the disclosure, instead of limiting the disclosure. Although the disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the disclosure.

What is claimed is:

1. A method for manufacturing a semiconductor structure, comprising:
   providing a substrate;
   forming a polysilicon layer on the substrate, wherein a surface, away from the substrate, of the polysilicon layer has a native oxide;
   performing a nitriding treatment to the native oxide, to nitrogenize the native oxide into a silicon oxynitride layer;
   forming a first mask layer and a first photoresist layer having a mask pattern on the silicon oxynitride layer; and
   removing a part of the first mask layer and a part of the silicon oxynitride layer by using the first photoresist layer as a mask, to form a plurality of mask bumps arranged at equidistant intervals, wherein the distance between every two adjacent mask bumps is constant.

2. The method for manufacturing a semiconductor structure of claim 1, wherein the performing the nitriding treatment to the native oxide comprises:
   performing plasma ionization to a nitrogen-containing gas to from nitrogen-containing plasma, and then treating the surface of the native oxide by the nitrogen-containing plasma.

3. The method for manufacturing a semiconductor structure of claim 2, wherein the nitrogen-containing gas comprises $NH_3$ and $N_2O$, or the nitrogen-containing gas comprises $NH_3$ and $N_2$, or the nitrogen-containing gas comprises $H_2N_2$.

4. The method for manufacturing a semiconductor structure of claim 1, after the polysilicon layer is formed on the substrate, and before the nitriding treatment is performed to the native oxide, comprising:
   measuring a thickness of the native oxide through a measurement device.

5. The method for manufacturing a semiconductor structure of claim 1, after the part of the first mask layer and the part of the silicon oxynitride layer is removed by using the first photoresist layer as a mask, comprising:
   forming a mask strip on a side wall of each of the mask bumps, with a top surface of the mask strip being flush with a top surface of the respective mask bump;
   removing the mask bumps, with the mask strips being retained and a first opening being formed between adjacent mask strips;
   removing a portion of the polysilicon layer exposed from the first opening, to form a plurality of second openings arranged at intervals in the polysilicon layer; and
   removing a part of the substrate exposed from the second opening, to form a plurality of trenches arranged at equidistant intervals in the substrate.

6. The method for manufacturing a semiconductor structure of claim 5, after the substrate exposed from the second opening is removed to form a plurality of trenches arranged at equidistant intervals in the substrate, comprising:
   depositing an insulating material in each trench to form a shallow trench isolation structure.

7. The method for manufacturing a semiconductor structure of claim 5, after the substrate exposed from the second opening is removed to form a plurality of trenches arranged at equidistant intervals in the substrate, comprising:
   forming word lines in the trenches.

8. The method for manufacturing a semiconductor structure of claim 5, wherein the first mask layer successively comprises a carbon layer, a first silicon nitride layer, a first hard mask layer, and a second silicon nitride layer that are stacked one above another; and the carbon layer is arranged on the silicon nitride layer.

9. The method for manufacturing a semiconductor structure of claim 1, after the nitriding treatment is performed to the native oxide, comprising:
   forming, a second mask layer and a second photoresist layer having a mask pattern, on the silicon oxynitride layer;
   removing a part of the second mask layer, a part of the silicon oxynitride layer, a part of the polysilicon layer and a part of the substrate by using the second photoresist layer as a mask, to form a plurality of bumps arranged at intervals, top surfaces of the plurality of the bumps being flush with one another; and
   forming a conductive layer between the adjacent bumps, with a top surface of the conductive layer being flush with a top surface of the polysilicon layer, and a vertical distance between the top surface of the conductive layer and a bottom surface of the substrate being a fixed value.

10. The method for manufacturing a semiconductor structure of claim 9, wherein the forming a conductive layer between the adjacent bumps comprises:

forming an initial conductive layer between the adjacent bumps, with the initial conductive layer covering the top surface of each bump; and removing a portion of the initial conductive layer located on the top surface of the bump, and partially removing a portion of the initial conductive layer between the adjacent bumps, to form a conductive layer by a residue of the initial conductive layer.

11. The method for manufacturing a semiconductor structure of claim 10, after the portion of the initial conductive layer located on the top surface of the bump is removed and the portion of the initial conductive layer between the adjacent bumps is partially removed to form a conductive layer by the residue of the initial conductive layer, further comprising:

removing a residue of the silicon oxynitride layer.

12. The method for manufacturing a semiconductor structure of claim 11, wherein the removing the residue of the silicon oxynitride layer comprises:

removing the residue of the silicon oxynitride layer by hydrofluoric acid (HF).

13. The method for manufacturing a semiconductor structure of claim 10, wherein the second mask layer successively comprises a first oxide layer, a second hard mask layer, a third silicon nitride layer, a third hard mask layer, a fourth silicon nitride layer, a second oxide layer, a fourth hard mask layer and a fifth silicon nitride layer that are stacked one above another; and the first oxide layer is arranged on the silicon oxynitride layer.

14. A method for manufacturing a semiconductor structure, comprising:

providing a substrate;

forming a polysilicon layer on the substrate, wherein a surface, away from the substrate, of the polysilicon layer has a native oxide;

performing a nitriding treatment to the native oxide, to nitrogenize the native oxide into a silicon oxynitride layer;

forming, a second mask layer and a second photoresist layer having a mask pattern, on the silicon oxynitride layer;

removing a part of the second mask layer, a part of the silicon oxynitride layer, a part of the polysilicon layer and a part of the substrate by using the second photoresist layer as a mask, to form a plurality of bumps arranged at intervals, top surfaces of the plurality of the bumps being flush with one another; and forming a conductive layer between the adjacent bumps, with a top surface of the conductive layer being flush with a top surface of the polysilicon layer, and a vertical distance between the top surface of the conductive layer and a bottom surface of the substrate being a fixed value.

15. The method of claim 14, wherein the forming a conductive layer between the adjacent bumps comprises:

forming an initial conductive layer between the adjacent bumps, with the initial conductive layer covering the top surface of each bump; and removing a portion of the initial conductive layer located on the top surface of the bump, and partially removing a portion of the initial conductive layer between the adjacent bumps, to form a conductive layer by a residue of the initial conductive layer.

16. The method of claim 15, after the portion of the initial conductive layer located on the top surface of the bump is removed and the portion of the initial conductive layer between the adjacent bumps is partially removed to form a conductive layer by the residue of the initial conductive layer, further comprising:

removing a residue of the silicon oxynitride layer.

17. The method of claim 16, wherein the removing the residue of the silicon oxynitride layer comprises:

removing the residue of the silicon oxynitride layer by hydrofluoric acid (HF).

18. The method of claim 15, wherein the second mask layer successively comprises a first oxide layer, a second hard mask layer, a third silicon nitride layer, a third hard mask layer, a fourth silicon nitride layer, a second oxide layer, a fourth hard mask layer and a fifth silicon nitride layer that are stacked one above another; and the first oxide layer is arranged on the silicon oxynitride layer.

* * * * *